United States Patent [19]
Yang et al.

[11] Patent Number: 5,237,597
[45] Date of Patent: Aug. 17, 1993

[54] BINARY COUNTER COMPILER WITH BALANCED CARRY PROPAGATION

[75] Inventors: Lin Yang, Fremont; Chun-Ling Liu, Milpitas, both of Calif.

[73] Assignee: VLSI Technology, Inc., San Jose, Calif.

[21] Appl. No.: 854,525

[22] Filed: Mar. 20, 1992

[51] Int. Cl.[5] ............................................. H03K 23/40
[52] U.S. Cl. ..................................... 377/111; 377/129
[58] Field of Search ................................ 377/111, 129

[56] References Cited

U.S. PATENT DOCUMENTS

| | | | |
|---|---|---|---|
| 4,679,216 | 7/1987 | Iida et al. | 377/111 |
| 4,815,114 | 3/1989 | Pham | 377/111 |
| 5,060,243 | 10/1991 | Eckert | 377/111 |

*Primary Examiner*—William L. Sikes
*Assistant Examiner*—Scott A. Ouellette
*Attorney, Agent, or Firm*—Burns, Doane, Swecker & Mathis

[57] ABSTRACT

An N-bit binary counter includes N 1-bit counters together producing an N-bit binary word, and a count enable signal generator for generating count enable signals for each of the N 1-bit counters. The count enable signal generator includes multiple logic group/carry ripple devices, different ones of which receive different numbers of bits of the binary word and generate count enable signals for the same number of bits. The logic group/carry ripple devices also receive a carry ripple output signal from an adjacent logic group/carry ripple device and generate a carry ripple output signal for another adjacent logic group/carry ripple device.

6 Claims, 3 Drawing Sheets

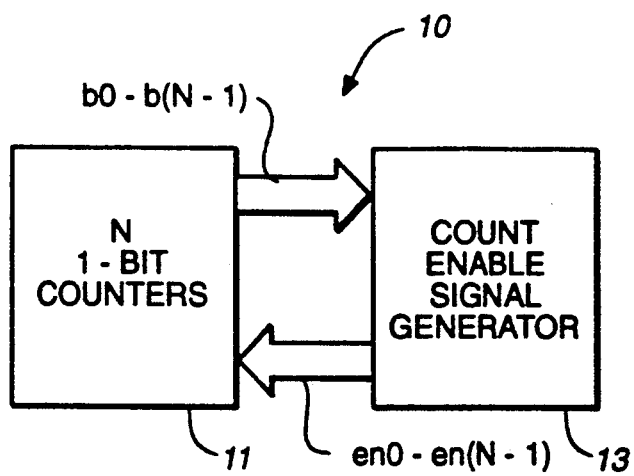
FIG._1
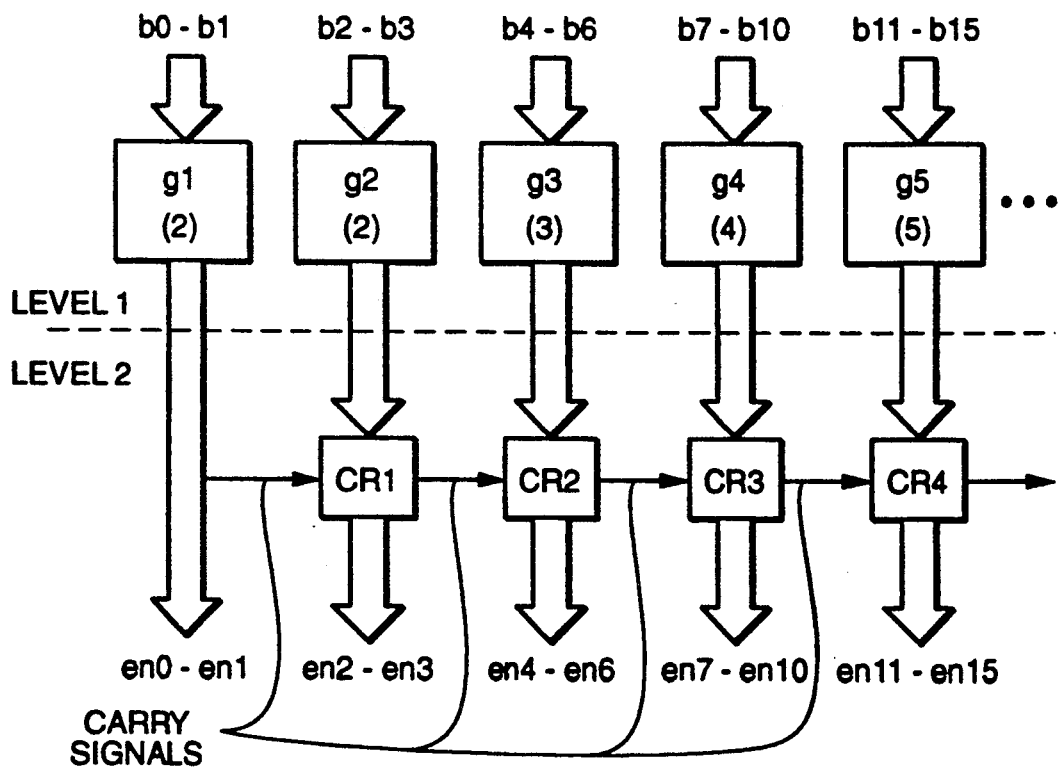
FIG._2

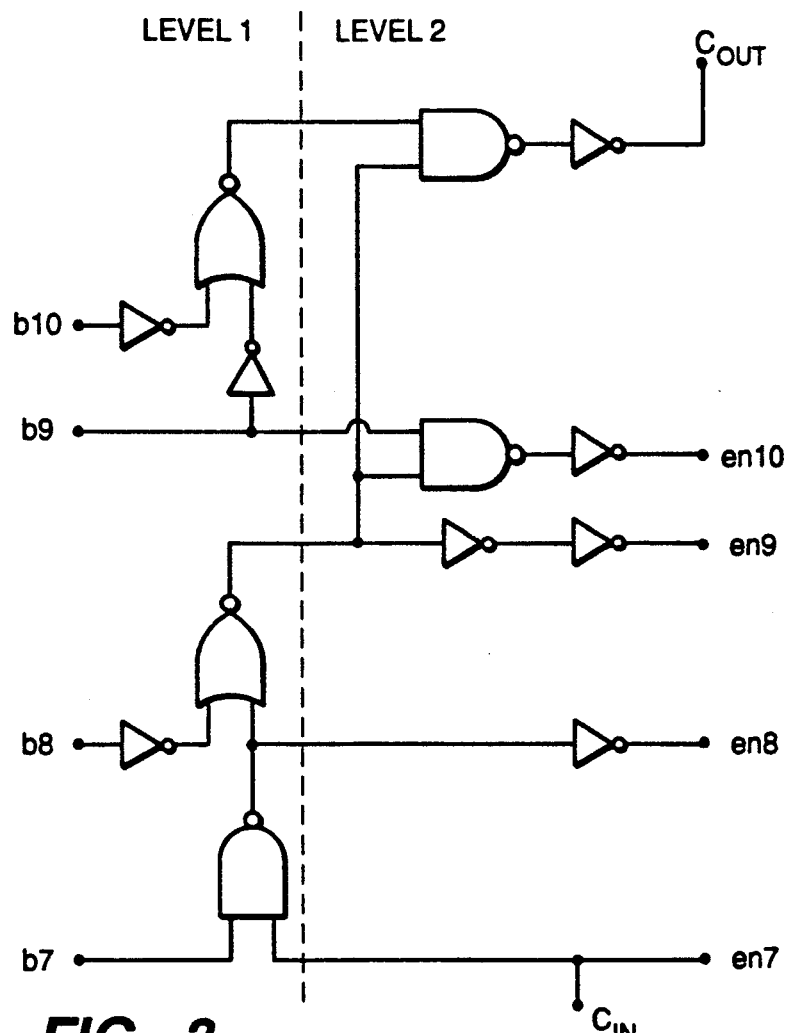
FIG._3
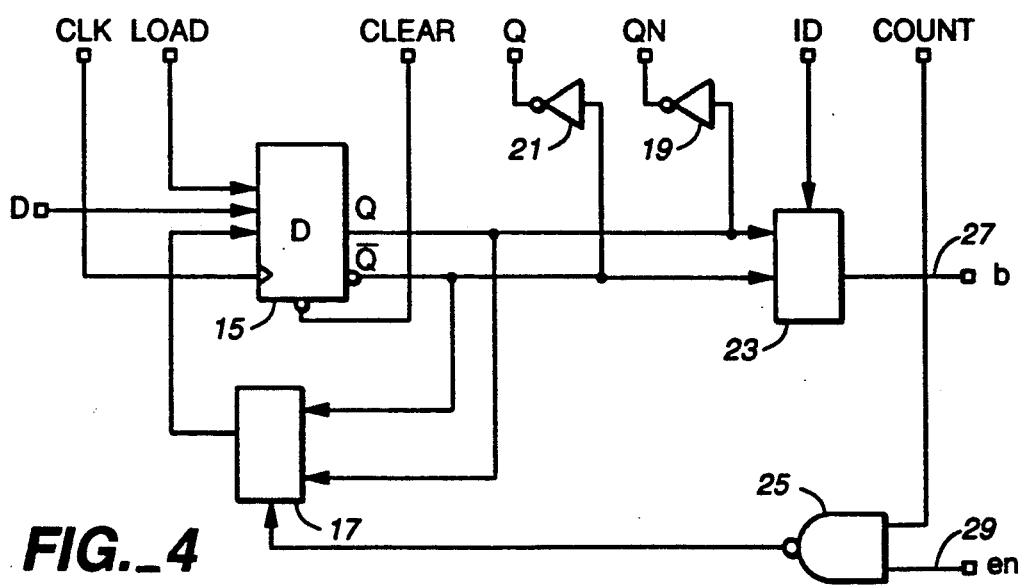
FIG._4

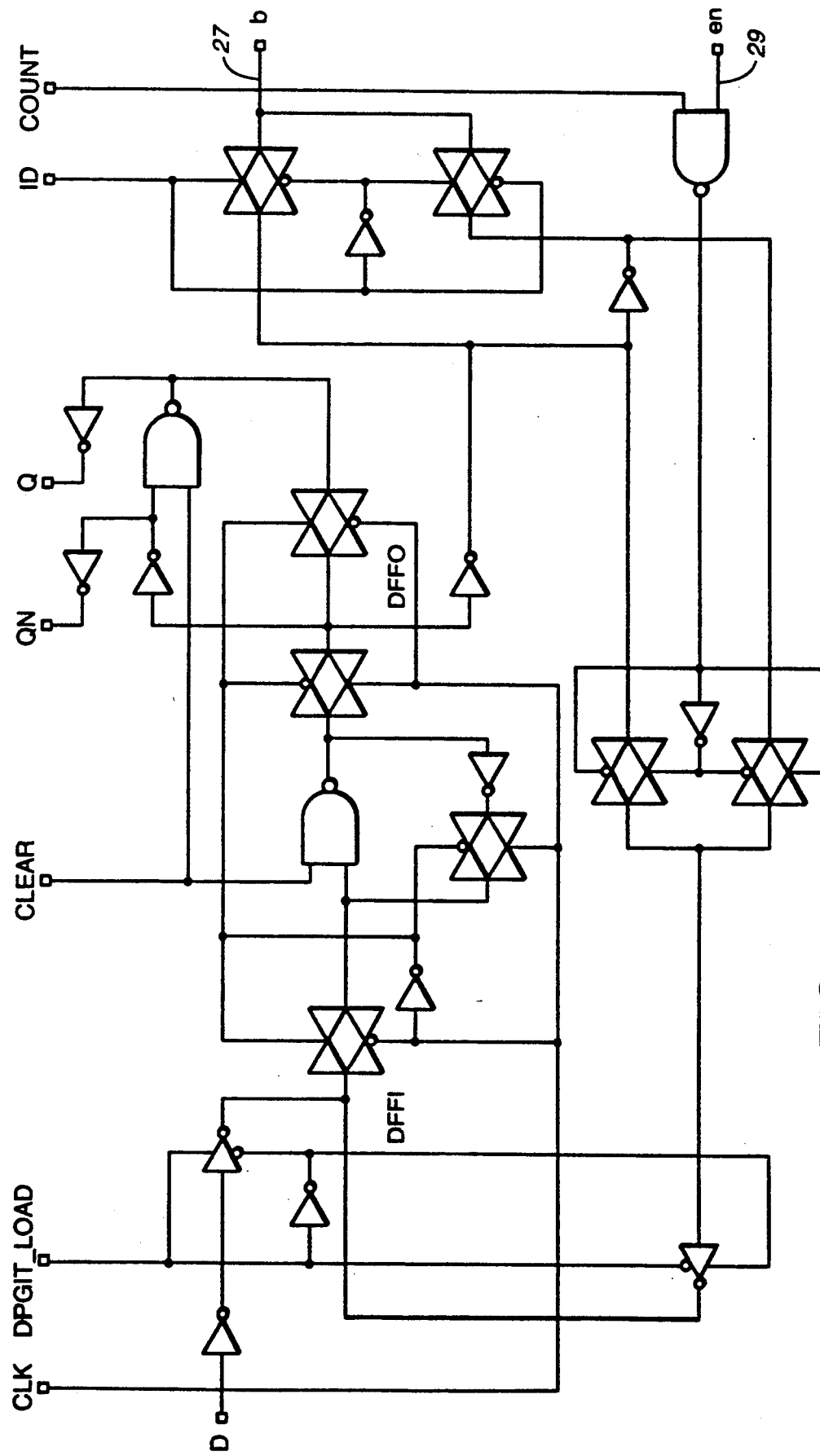
FIG._5

BINARY COUNTER COMPILER WITH BALANCED CARRY PROPAGATION

BACKGROUND OF THE INVENTION

1. Field of the Invention

The present invention relates to binary counters and particularly to a binary counter that may be easily compiled using a chip layout design program, or silicon compiler.

2. State of the Art

Binary counters are widely used in digital devices of all types. Specific circuits for implementing binary counters are well-known in the art. Such circuits have not been readily compilable, however, using compiler programs. For compilability, the circuit should be fast, dense and regular in its layout. The present invention provides a binary counter circuit that exhibits each of these features.

SUMMARY OF THE INVENTION

According to the present invention, an N-bit binary counter includes N 1-bit counters together producing an N-bit binary word, and a count enable signal generator for generating count enable signals for each of the N 1-bit counters. The count enable signal generator includes multiple logic group/carry ripple devices, different ones of which receive different numbers of bits of the binary word and generate count enable signals for the same number of bits. The logic group/carry ripple devices also receive a carry ripple output signal from an adjacent logic group/carry ripple device and generate a carry ripple output signal for another adjacent logic group/carry ripple device.

DESCRIPTION OF THE DRAWINGS

The present invention can be further understood with reference to the following description in conjunction with the appended drawings. In the drawings:

FIG. 1 is a block diagram of the N-bit binary counter of the present invention;

FIG. 2 is a block diagram of the count enable signal generator of FIG. 1;

FIG. 3 is a logic diagram of a 4-bit logic group/carry ripple device for use in the count enable signal generator of FIG. 2;

FIG. 4 is a block diagram of a 1-bit counter; and

FIG. 5 is a transistor-level diagram of the 1-bit counter of FIG. 4.

DETAILED DESCRIPTION OF THE PREFERRED EMBODIMENT

Referring now to FIG. 1, N 1-bit counters, collectively designated by reference numeral 11, may be effectively combined to form a single N-bit counter 10 using a count enable signal generator 13. Each of the N 1-bit counters produces a 1-bit output signal. Together, the N output signals $b_0$-$b(N-1)$ are input to the count enable signal generator 13 and used to generate N count enable signals $en0$-$en(N-1)$, which are fed back to respective ones of the N 1-bit counters. Each of the 1-bit counters, when enabled, causes its output signal to change state upon the next transition of a common clock signal.

Referring now to FIG. 2, the count enable signal generator 13 of FIG. 1 is arranged according to an architecture in which a number of similarly-constituted logic groups g1-g5 at a first level (level 1) provide output signals to respective stages (CR1-CR4) of a carry ripple chain at a second level (level 2). The logic groups receive as input signals the bits of the binary word formed by the collective output signals of the N 1-bit counters 11.

The logic groups are of variable length in that different logic groups receive different numbers of bits of the binary word. The term "group length" refers to the number of bits received by a particular logic group and is indicated in parentheses inside each logic group in FIG. 2. The first and second logic groups g1 and g2 each have a group length of 2, after which the group length increases by one for each logic group. The logic groups consist of logic circuits including NAND gates, NOR gates and inverters. Each logic group produces an output signal of a number of bits equal to the group length. The output signals of the logic groups are input to respective stages of the carry ripple chain on level 2.

The carry ripple stages CR1-CR4 on level 2 are similarly-constituted and are series connected to form a carry ripple chain. Each carry ripple stage receives a carry ripple output signal from a previous carry ripple stage and produces a carry ripple output signal for a succeeding carry ripple stage in accordance with the output signal of its associated logic group. In the case of the first carry ripple stage CR1, since it is not preceded by any other carry ripple stage, it receives as a carry ripple input signal one bit of the output signal of the first logic group g1. In the case of the last carry ripple stage, its carry ripple output signal serves as part of the output signal of the binary counter.

A 4-bit count enable signal generator may be realized according to the logic diagram of FIG. 3. Recall that when a count enable signal is generated it causes the output signal of the corresponding 1-bit counter to change state upon the occurrence of the next clock transition. For any particular logic group, the logic group must therefore generate count enable signals for each input bit such that the count enable signal for a particular bit is asserted if and only if that bit is to change state with the next count. For example, in the case of 4-bit counter, as the count proceeds from 0000 to 0001, only the least significant bit changes state, and hence only the least significant bit should have the corresponding count enable signal asserted. As the count proceeds from 1111 back to 0000, all bits change state and hence all of the bits should have their corresponding count enable signals asserted. Each group in the count enable signal generator must also respond to a carry input signal cin and produce a carry output signal cout. In the present embodiment, the carry input signal and the carry output signal are both asserted high.

The 4-bit count enable signal generator of FIG. 3 operates in accordance with the truth table set forth in Table 1 below.

TABLE 1

| cin | $b_3$-$b_0$ | | $en3$-$en0$ | cout |
|---|---|---|---|---|
| 1 | 0000 | => | 0001 | 0 |
| 1 | 0001 | => | 0011 | 0 |
| 1 | 0010 | => | 0001 | 0 |
| 1 | 0011 | => | 0111 | 0 |
| 1 | 0100 | => | 0001 | 0 |
| 1 | 0101 | => | 0011 | 0 |
| 1 | 0110 | => | 0001 | 0 |
| 1 | 0111 | => | 1111 | 0 |
| 1 | 1000 | => | 0001 | 0 |
| 1 | 1001 | => | 0011 | 0 |
| 1 | 1010 | => | 0001 | 0 |

TABLE 1-continued

| cin | b₃-b₀ |  | en3-en0 | cout |
|---|---|---|---|---|
| 1 | 1011 | => | 0111 | 0 |
| 1 | 1100 | => | 0001 | 0 |
| 1 | 1101 | => | 0011 | 0 |
| 1 | 1110 | => | 0001 | 0 |
| 1 | 1111 | => | 1111 | 1 |

As may be seen from Table 1, the carry output signal cout is asserted only in response to an input signal of all ones. When the carry input signal cin is deasserted rather than asserted as shown in the table, the count enable signals generated are all zeros, signifying that occurrence of the next count value affects only bits lower than the bits corresponding to the present group, which are left unchanged.

For example, in the circuit of FIG. 2, the circuit of FIG. 3 may be used to realize the group g4 and the carry ripple stage CR3 as part of a larger overall count enable signal generator. When the count is 02FF hex, bits b0-b6 are all ones, causing the carry-out signal of CR2, also the carry-in signal of CR3, to be asserted. Bits b7-b10 input to group g4 are 0101, such that enable signals 0011 are generated in accordance with Table 1, resulting in a count of 0300 hex (bit b7-b10=0110). When the count is 02FE hex, on the other hand, although bits b7-b10 are again 0101, the carry-in signal of CR3 is deasserted such that enable signals 0000 are generated. The resulting count is 02FF hex (bits b7-b10 remain 0101).

Referring now to FIG. 4, each of the N 1-bit counters consists principally of a D-type flip flop 15, a 2:1 multiplexer 17 and a control circuit 25 formed of a NAND gate. In addition, the 1-bit counter includes a second 2:1 multiplexer 23 and two output drivers 19 and 21. The flip flop 15 is reset upon occurrence of a clear signal and produces complementary outputs Q and $\overline{Q}$, which are input to the multiplexer 17. Depending on the output of the NAND gate 25, either Q or $\overline{Q}$ is selected as the output of the multiplexer 17 and fed back to the input of the flip flop 15 to be clocked into the flip flop upon the occurrence of the next clock signal clk. The NAND gate 25 selects $\overline{Q}$ as the output of the multiplexer 17 when a count signal and a count enable signal en input from the count enable signal generator on line 29 are both asserted. Otherwise, the NAND gate 25 selects Q as the output of the multiplexer 17. The flip flop 15 may also be loaded with a 1-bit signal d upon occurrence of a load signal.

The outputs Q and $\overline{Q}$ are amplified and inverted by drivers 19 and 21, respectively, to form true and inverted output signals q and qn. The outputs Q and $\overline{Q}$ are also input to the multiplexer 23 and selected between to produce an output signal b for input to the carry signal generator. The output of the multiplexer 23 is selected according to an increment/decrement signal id. Depending on the value of the signal id, the counter either counts up or counts down. When $\overline{Q}$ is selected as the output signal of the multiplexer 23, the counter counts down. This feature may be appreciated with reference again to Table 1. For example, when the true output of the counter is 0111, selecting the inverted output 1000 for input to the count enable signal generator causes a count enable signal 0001 to be generated, which in turn causes the least significant bit of the true output signal 0111 to transition, resulting in the next lower count, 0110.

The 1-bit counter of FIG. 4 may be realized according to the transistor-level diagram of FIG. 5.

Several features of the count enable signal generator of FIG. 3 contribute to its being readily compilable. First, none of the inputs experiences any more than 5 gate delays. Some of the inputs experience as few as two gate delays. As a result, the circuit is very fast. Also, the circuit is very dense, connections between the various logic elements requiring only a minimum of space. Finally, the circuit is very regular. All of the inputs run parallel to one another.

Furthermore, all of the logic groups are substantially similar to one another.

The foregoing has described the principals, preferred embodiments and modes of operation of the present invention. However, the invention should not be construed as limited to the particular embodiments discussed. Instead, the above-described embodiments should be regarded as illustrative rather than restrictive, and it is should be appreciated that variations may be made in the embodiments by workers skilled in the art without departing from the scope of the present invention as defined by the following claims.

What is claimed is:

1. An N-bit binary counter comprising:
   N 1-counters together producing an N-bit binary word; and
   count enable signal generator means for generating count enable signals for each of said N 1-bit counters, said count enable signal generator means including a plurality of logic group/carry ripple means, different ones of said logic group/carry ripple means receiving different unique sets, without repetition, of different numbers of contiguous bits of said binary word, logic group carry ripple means receiving more significant bits of said binary word receiving a greater number of bits than logic group/carry ripple means receiving less significant bits of said binary word, each of said logic group/carry ripple means for generating count enable signals for said number of bits of said binary word, receiving a carry ripple output signal from an adjacent logic group/carry ripple means, and generating a carry ripple output signal for another adjacent logic group/carry ripple means.

2. The apparatus of claim 1 wherein said N 1-bit counters each comprises a D-type flip flop.

3. The apparatus of claim 2 wherein said N 1-bit counters each further comprises selector means for selecting one of a true output and an inverted output of said D-type flip flop for feedback to an input of said D-type flip flop.

4. The apparatus of claim 3 wherein said N 1-bit counters each further comprises control means responsive to a corresponding count enable signal for controlling said selecting means.

5. The apparatus of claim 4 wherein said N 1-bit counters each further comprises selector means for selecting one of a true output and an inverted output of said D-type flip flop as part of said N-bit binary word.

6. The apparatus of claim 5 wherein said N 1-bit counters each further comprises control means responsive to an up/down signal input to each of said N 1-bit binary counters for causing said N-bit binary counter to count in one of an up direction and a down direction.

* * * * *